United States Patent
Takeuchi et al.

(10) Patent No.: US 7,342,843 B2
(45) Date of Patent: Mar. 11, 2008

(54) SEMICONDUCTOR INTEGRATED CIRCUIT DEVICE

(75) Inventors: Hideki Takeuchi, Yokohama (JP); Takuya Fujimoto, Yokohama (JP); Yoshiharu Hirata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 11/110,715

(22) Filed: Apr. 21, 2005

(65) Prior Publication Data

US 2005/0237842 A1    Oct. 27, 2005

(30) Foreign Application Priority Data

Apr. 22, 2004  (JP) ............................. 2004-126843

(51) Int. Cl.
*G11C 17/18*    (2006.01)
(52) U.S. Cl. ................. 365/225.7; 365/210; 365/185.2
(58) Field of Classification Search ........... 365/230.03, 365/185.05, 185.11, 185.2, 210, 225.7
See application file for complete search history.

(56) References Cited

U.S. PATENT DOCUMENTS

| | | | |
|---|---|---|---|
| 6,477,094 B2 | 11/2002 | Kim et al. | |
| 6,545,920 B2 | 4/2003 | Lee et al. | |
| 6,567,315 B2 * | 5/2003 | Takase et al. | 365/185.28 |
| 6,717,877 B2 * | 4/2004 | Suzuki et al. | 365/210 |
| 2001/0009527 A1 * | 7/2001 | Tanzawa et al. | 365/207 |

FOREIGN PATENT DOCUMENTS

| | | |
|---|---|---|
| JP | 5-234385 | 9/1993 |
| JP | 11-17155 | 1/1999 |
| JP | 2000-149588 | 5/2000 |
| JP | 2003-110034 | 4/2003 |

* cited by examiner

*Primary Examiner*—Son Dinh
(74) *Attorney, Agent, or Firm*—Oblon, Spivak, McClelland, Maier & Neustadt, P.C.

(57) ABSTRACT

A semiconductor integrated circuit device comprises a semiconductor memory circuit including a memory cell array in which normal cells are integrated and a fuse circuit in which fuse cells that store operation information of the semiconductor memory circuit are integrated. The fuse cell is of a 2-transistor type memory cell which comprises a cell transistor having a charge storage layer and a selection transistor which selects the cell transistor.

15 Claims, 12 Drawing Sheets

Redundancy circuit 17

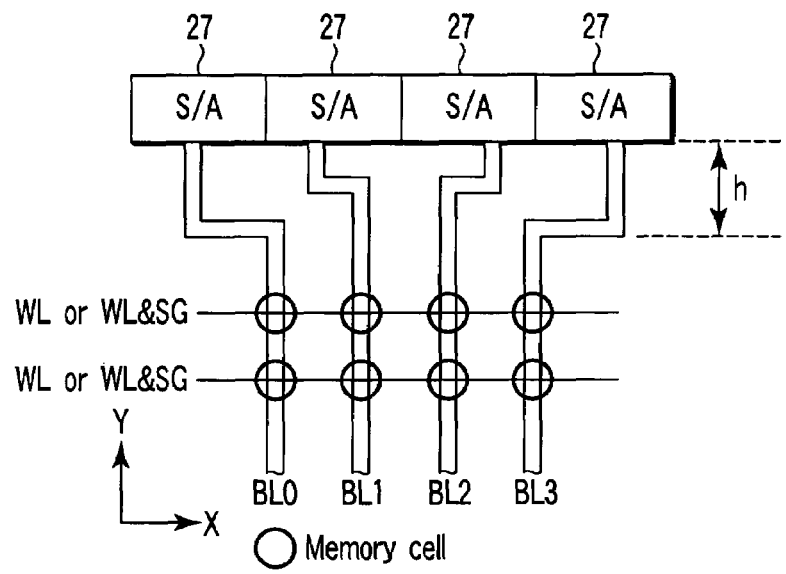
FIG. 10 (REFERENCE EXAMPLE)
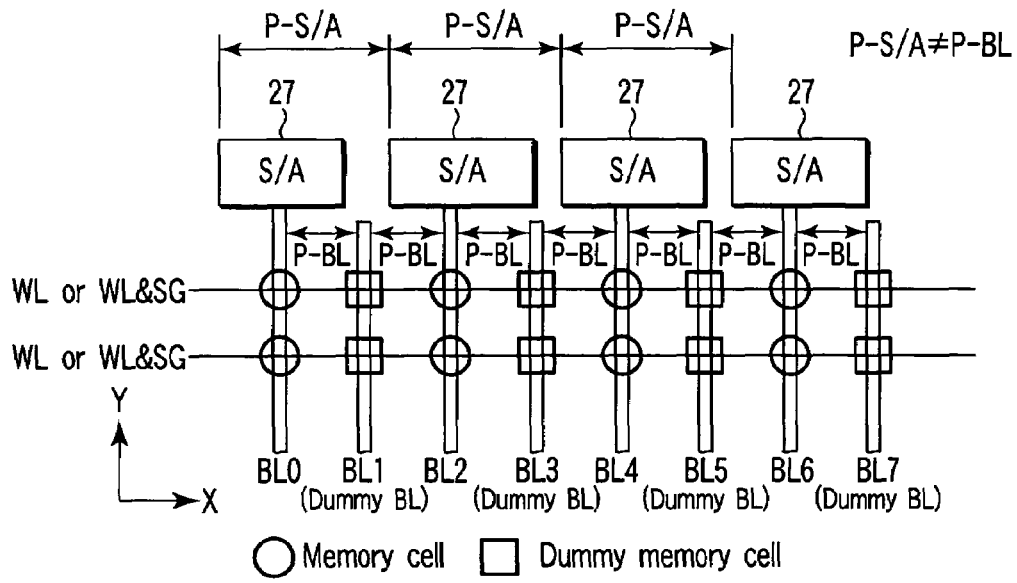
FIG. 11

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2004-126843, filed Apr. 22, 2004, the entire contents of which are incorporated herein by reference.

BACKGROUND OF THE INVENTION

1. Field of the Invention

The present invention relates to a semiconductor integrated circuit device, and in particular, to a semiconductor integrated circuit device having a fuse circuit.

2. Description of the Related Art

As a semiconductor integrated circuit device which has a fuse circuit, a semiconductor memory is well known. The semiconductor memory has a memory cell array with memory cells which are memory elements arranged in a matrix. The semiconductor memory has a spare memory cell (redundant cell) in addition to a regular memory cell (normal cell). When the normal cell fails, the failed normal cell is replaced with the redundant cell. This is a so-called redundancy technique.

For example, in order to identify a failed normal cell, the position thereof, that is, a failure address must be identified in the redundancy technique. In the event that the failure address is unknown, it is unable to be replaced with the redundant cell. In order to identify the failure address, the semiconductor memory has a fuse circuit in addition to the memory cell array. The failure address is stored in the fuse circuit. The memory element mounted in the fuse circuit is in general a fuse. The fuse stores "0" or "1" data depending on whether or not the current route is physically cut. The fuse is one of nonvolatile memory elements. Hereinafter, the fuse is called a fuse cell in the present specification.

Fuse cells are integrated in the fuse circuit, but a structure of the fuse cell differs from a structure of the memory cell. Consequently, a fuse cell manufacturing process differs from a memory cell manufacturing process and a fuse cell forming step is separately required. Therefore, in a nonvolatile semiconductor memory of semiconductor memories, there is an example in which a fuse cell is replaced with a nonvolatile memory cell. The example is U.S. Pat. No. 6,052,313. As described in U.S. Pat. No. 6,052,313, a 1-transistor type memory cell with a floating gate is used for a fuse cell. The 1-transistor type memory cell is a nonvolatile memory cell which varies a threshold value in accordance with whether or not electrons are injected to the floating gate, and "0" or "1" data is stored depending on the change of the threshold value.

In the 1-transistor type memory cell, however, the memory cell must accurately be controlled whether to turn on or off. This is to prevent data error. Consequently, at the time of writing data, the threshold value must be strictly adjusted, and it takes time to write data.

In addition, the 1-transistor type memory cell requires a large current, for example, to inject electrons into the floating gate by the use of hot-electron when data is written. Therefore, current consumption is also large.

BRIEF SUMMARY OF THE INVENTION

A semiconductor integrated circuit device according to a first aspect of the present invention comprises: a semiconductor memory circuit including a memory cell array in which normal cells are arranged; and a fuse circuit in which fuse cells that store operation information of the semiconductor memory circuit are arranged, wherein the fuse cell is of a 2-transistor type memory cell comprises a cell transistor having a charge storage layer and a selection transistor which selects the cell transistor.

A semiconductor integrated circuit device according to a second aspect of the present invention comprises: a plurality of sense amplifiers; a plurality of bit lines connected to the plurality of sense amplifiers; a plurality of memory cells connected to the plurality of bit lines; dummy bit lines arranged between the plurality of bit lines; and a plurality of dummy memory cells connected to the dummy bit lines.

A semiconductor integrated circuit device according to a third aspect of the present invention comprises: a first local bit line group which includes a plurality of local bit lines; a second local bit line group which includes a plurality of local bit lines; a first global bit line connected to the plurality of local bit lines of the first local bit line group; a second global bit line connected to the plurality of local bit lines of the second local bit line group; a sense amplifier connected to the first global bit line; and a sense amplifier connected to the second global bit line.

BRIEF DESCRIPTION OF THE SEVERAL VIEWS OF THE DRAWING

FIG. 10 is a circuit diagram that indicates a semiconductor integrated circuit device according to a reference example of a fourth embodiment of the invention;

FIG. 11 is a circuit diagram that indicates a semiconductor integrated circuit device according to the fourth embodiment of the invention;

DETAILED DESCRIPTION OF THE INVENTION

Figure 1:
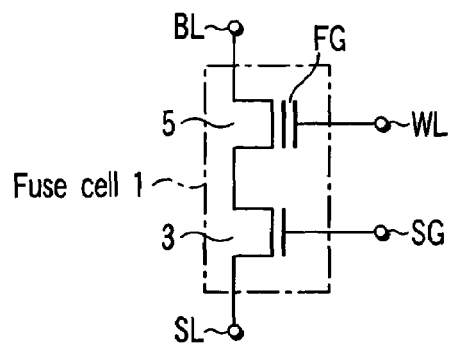
FIG. 1 is a circuit diagram that indicates a semiconductor integrated circuit device according to a first embodiment of the invention.

Now, embodiments of the present invention will be described with reference to the accompanying drawings. In this description, like reference characters designate like or corresponding parts throughout all the figures.

First Embodiment

FIG. 1 is a circuit diagram that indicates a semiconductor integrated circuit device according to a first embodiment of the present invention.

As shown in FIG. 1, in the first embodiment, a 2-transistor type memory cell is used as a fuse cell 1 integrated into a fuse circuit. The fuse cell 1 comprises one selection transistor 3 and one cell transistor 5. The selection transistor 3 is a general transistor, and the cell transistor 5 is a transistor which has a charge storage layer, for example, a floating gate FG. A source of the selection transistor 3 is connected to a source line SL, and a drain of the selection transistor 3 is connected to a source of the cell transistor 5. A drain of the cell transistor 5 is connected to a bit line BL. A gate of the selection transistor 3 is connected to a selection gate line SG. A gate of the cell transistor 5 is connected to a word line WL.

Next, operation of the fuse cell 1 will be briefly explained.

(Reading Operation)

When data is read, a fuse cell 1 from which data is desired to be read is selected. The fuse cell 1 is selected in accordance with the potential of the selection gate line SG. For example, when the potential of the selection gate line SG becomes the "H" level, the selection transistor 3 turns on, and its fuse cell 1 is selected. Conversely, when the potential of the selection gate line SG is "L," the selection transistor 3 turns off, and its fuse cell 1 is not selected.

When data is read, the word line WL is not used for selecting the fuse cell 1. When data is read, the potential of all the word lines WL is brought to the "L" level, for example, 0V. In such an event, if a threshold value Vthcell of the cell transistor 5 is less than the potential of the word line WL, for example, "Vthcell<0V," the cell transistor 5 is held turned on. Conversely, when the threshold value Vthcell exceeds the potential of the word line WL, for example, "Vthcell>0V," the cell transistor 5 is held turned off. When the selection transistor 3 is turned on, the current rate that flows between the bit line BL and the source line SL varies in accordance with whether the cell transistor 5 is in the ON or OFF state. This change is detected by, for example, a sense amplifier and whether the read data is "1" or "0" is determined.

Hereinafter, in the specification, data when "Vthcell<0V" is designated as "1" and data when "Vthcell>0V" is designated as "0."

(Writing Operation)

When data is written, a fuse cell 1 to which data is desired to be written is selected. The fuse cell 1 is selected in accordance with the potential of the word line WL. For example, assuming that the potential of the word line WL is a write potential VPP (for example, 12V), the fuse cell 1 connected to the word line WL is selected. Conversely, assuming that the potential of the word line WL is "L" (for example, 0V), the fuse cell 1 connected to the word line WL is not selected.

When data is written, the selection gate line SG is not used for selecting the fuse cell 1. When data is written, the potential of all the selection gate lines SG is brought to a negative potential VBB, for example, −8V. As a result, all the selection transistors 3 are brought to the OFF state.

The write data is given from the bit line BL to the fuse cell 1. When the write data is "1," the potential of the bit line BL becomes the "1" level (for example, 0V), and the potential of the drain of the cell transistor 5 becomes 0V. Because the potential of the gate of the write-selected fuse cell 1 is 12V, the potential difference between the gate potential and the potential of the drain and channel of the write-selected cell transistor 5 is 12V.

Conversely, when the write data is "0," the potential of the bit line BL becomes the "0" level (for example, −8V), and the potential of the drain and channel of the cell transistor 5 becomes −8V. The potential difference between the gate potential and the potential of the drain and channel of the write-selected cell transistor 5 becomes 20V.

Now, if the characteristics of the cell transistor 5 are set in such a manner that a Fowler-Nordheim (FN) tunnel current flows to the floating gate FG at the potential difference of 20V and conversely it does not flow at the potential difference of 12V, it is possible to distinguish "1" data and "0" data in writing. In this example, since electrons are not injected to the floating gate FG when the write data is "1", the cell transistor 5 holds "Vthcell<0V." Conversely, because electrons are injected in the floating gate FG when write data is "0," the cell transistor 5 becomes "Vthcell>0V."

(Erasing Operation)

When data is deleted, a fuse cell 1 from which data is desired to be deleted is selected. The fuse cell 1 is selected in accordance with the potential of the word line WL. For example, assuming that the potential of the word line WL is a negative potential VBB, for example, −8V, the fuse cell 1 connected to the word line WL is selected. On the other hand, in the event that the word line WL is floated, the fuse cell 1 connected to the word line is not selected.

When data is erased, the selection gate line SG is not used for selecting the fuse cell 1. When data is erased, all the selection gate lines SG are floated.

When data is erased, the potential of a well region in which the selection transistor 3 and cell transistor 5 are formed becomes an erasing potential VEE, for example, 20V. Because the gate potential of the cell transistor 5 selected for erasure is −8V, the potential difference between the gate potential and the channel (well region) potential of the cell transistor 5 selected for erasure becomes 28V.

On the other hand, since the gate of the non-selected cell transistor 5 is floated, the gate potential of a non-selected cell transistor 5 becomes 20V which is the same as that of the well region, by coupling with the well region. there is no potential difference between the gate and the channel (well region) of the non-selected cell transistor 5.

Consequently, in the cell transistor 5 in which the potential difference of 28V is generated between the gate and the channel (well region), the FN tunnel current flows toward the well region and the cell transistor 5 becomes "Vthcell<0V." Data is "1" and data is deleted. In the cell transistor 5 which has no potential difference between the gate and the channel (well region), the FN tunnel current does not flow and either data "1" or data "0" is held.

The foregoing is the outline of the reading operation, writing operation, and erasing operation.

Meanwhile, the 2-transistor type memory cell provides a faster data write speed than the 1-transistor type memory cell. This is attributed to the following reasons.

The 1-transistor type memory cell has, in general, "1" and "0" data threshold value distributions made to achieve a positive potential of 0V or higher. Consequently, the "1" data threshold value distribution ΔVthcell must be strictly adjusted to a narrow range of "non-select word line potential (for example, 0V)<ΔVthcell<select word line potential (for example, 3V)". Accordingly, in the write sequence, verify-reading is repeated, and the "1" data threshold value distribution ΔVthcell is driven into the narrow range. Specifically, the write sequence comprises the following three steps:

(1) preprogram step (electric charges are injected into floating gates of all the memory cells and data of all the memory cells are aligned to "0");

(2) erasing step (electric charges are removed from floating dates of all the memory cells and data of all the memory cells are brought to "1"); and (3) program step (electric charges are injected only to floating gate(s) of the memory cell(s) to which data "0" is written).

The erasing step and program step carry out verify reading, which reads threshold values while verification is being carried out. This is to drive the "1" data threshold value distribution into the narrow range.

In addition, in order to avoid over-erasing, the erasing process carries out self-convergence, and the threshold value must be returned to a level in which the threshold value is turned off, for example, at the non-select word line potential.

Consequently, the 1-transistor type memory cell needs time to write data.

On the other hand, the 2-transistor type memory cell needs following two stages only:

(1) erasing step; and
(2) program step.

In the 2-transistor type memory cell, a selection transistor carries out select and no-select of memory cells. Therefore, the "1" data threshold value distribution may be set to the word line potential at the time of reading, for example, the negative potential of 0V or lower, and the "0" data threshold value distribution may be set to the word line potential at the time of reading, for example, the positive potential of 0V and higher. In particular, the "1" data threshold value distribution ΔVthcell does not need to be adjusted strictly to a narrow range unlike the 1-transistor type memory cell, but simply set to "ΔVthcell<word line potential (for example, 0V) at the time of reading." The verify-reading of 2-transistor type memory cell at the time of erasing step only needs determination as to whether or not the memory-cell threshold value becomes the word line potential at the time of reading or lower. As is the case of the 1-transistor type memory cell, there is no need to determine two things: the fact that the memory cell threshold value becomes the select word line potential or lower and the fact that the memory cell threshold value becomes the non-select word line potential or higher. Furthermore, because the 2-transistor type memory cell has no over-erase, self-convergence is no longer necessary to be carried out.

As described above, because according to the first embodiment, the 2-transistor type memory cell can be used for the fuse cell, the data can be written quickly as compared to the case in which the 1-transistor type memory cell is used for the fuse cell.

In addition, because the 2-transistor type memory cell injects electrons into the floating gate by using the FN tunnel current at the time of data writing, no large current is required. Consequently, as compared to the case in which the 1-transistor type memory cell is used for the fuse cell, reduced power consumption can be achieved.

Figure 2:
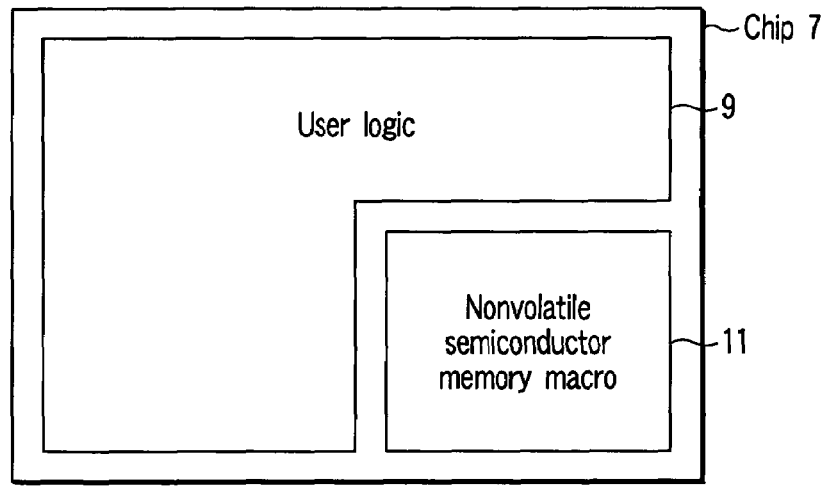
FIG. 2 is a block diagram that indicates one example of a semiconductor integrated circuit device having a fuse circuit.

FIG. 2 is a block diagram that indicates one example of a semiconductor integrated circuit device that has a fuse circuit.

The example shown in FIG. 2 is a so-called system LSI, in which a logic circuit and a semiconductor memory are integrated into one chip. A chip 7 has a user logic 9 as a logic circuit and has a nonvolatile semiconductor macro 11 as a semiconductor memory.

Figure 3:
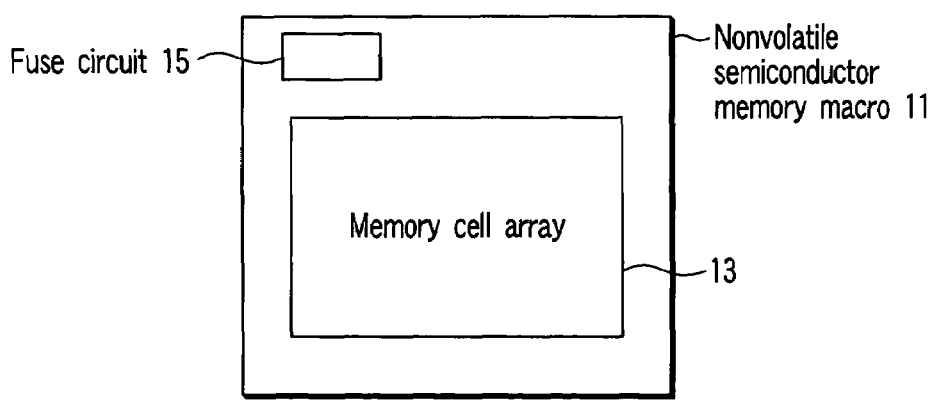
FIG. 3 is an enlarged view of a nonvolatile semiconductor memory macro shown in FIG. 2.

FIG. 3 is an enlarged view of the nonvolatile semiconductor memory macro 11 shown in FIG. 2.

As shown in FIG. 3, the memory macro 11 has a fuse circuit 15 in addition to a memory cell array 13. Fuse cells comprising 2-transistor type memory cells shown in FIG. 1 are integrated in the fuse circuit 15. In the fuse circuit 15, operation information of the memory macro 11, for example, a failure address in the memory cell array 13 is stored. In the memory cell array 13, nonvolatile semiconductor memory cells are integrated.

In this way, the first embodiment can be applied to, for example, a system LSI. Needless to say, the first embodiment is not limited to the system LSI, but can be applied to, for example, a general semiconductor memory with the user logic eliminated from the system LSI shown in FIG. 2, and can be applied to semiconductor products other than the semiconductor memory.

Figure 4:
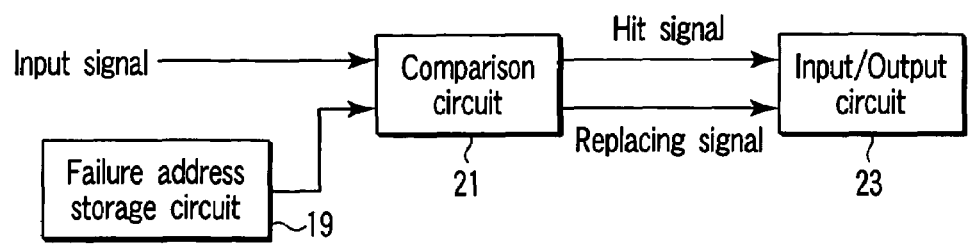
FIG. 4 is a block diagram that indicates one example of a redundancy circuit using a fuse circuit.

FIG. 4 is a block diagram that indicates one example of a redundancy circuit using a fuse circuit.

As shown in FIG. 4, the redundancy circuit 17 includes a failure address storage circuit 19, a comparison circuit 21, and an input/output circuit 23. The failure address storage circuit 19 is a fuse circuit, which integrates fuse cells comprising 2-transistor type memory cells shown in FIG. 1 and stores failure addresses. The comparison circuit 21 compares input signals, for example, compares an input address with a failure address. In the case where an input address coincides with a failure address, the comparison circuit 21 outputs a hit signal and a replacing signal to the input/output circuit 23. The input/output circuit 23 includes, for example, a normal sense amplifier circuit connected to a normal bit line and a redundant sense amplifier circuit connected to a redundant bit line. This is one example of column redundancy for replacing a generally used column (normal column) that includes a defective memory cell with a preliminary column (redundant column). When the hit signal and the replacing signal are output, the input address coincides with the failure address, and thus, column replacement is executed. That is, the normal sense amplifier circuit is disabled and the redundant sense amplifier circuit is enabled. Consequently, the normal column that includes a defective memory cell is replaced with the redundant column.

In this way, the first embodiment can be applied to, for example, the redundancy circuit 17. Needless to say, the first embodiment can be applied to circuits other than the redundancy circuit.

Second Embodiment

A second embodiment of the invention is an example related to contraction of a layout area of a fuse circuit.

Figure 5:
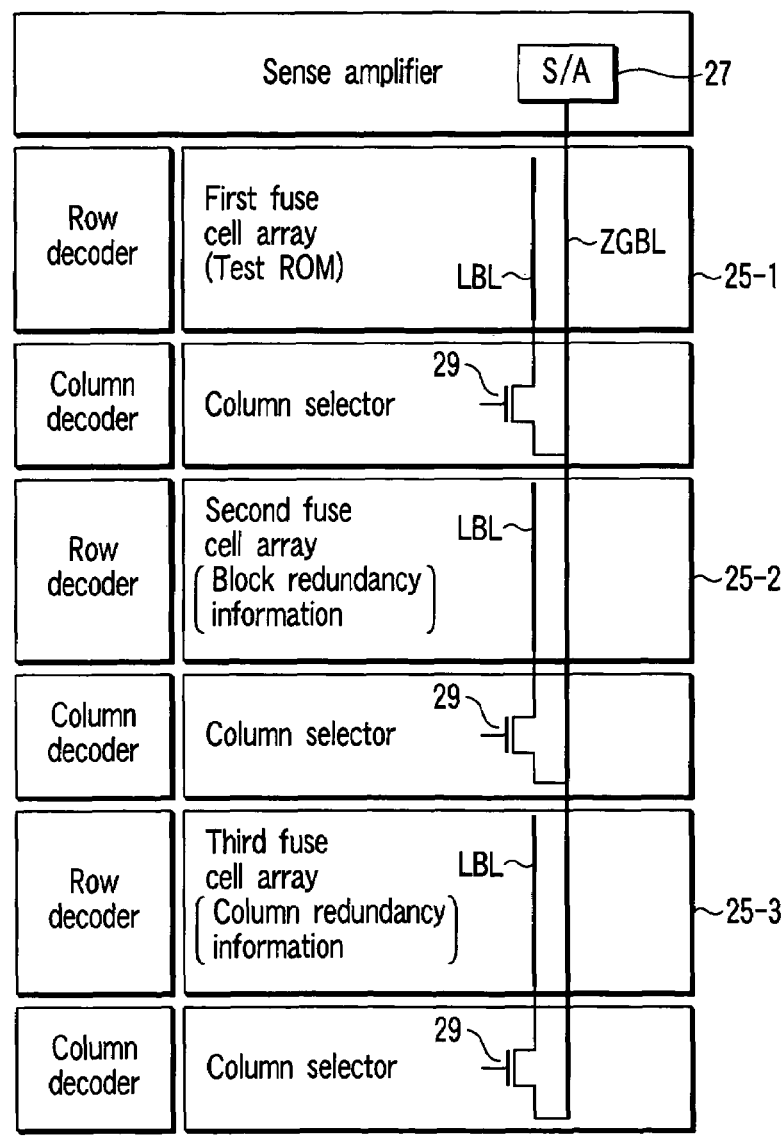
FIG. 5 is a block diagram that indicates a semiconductor integrated circuit device according to a second embodiment of the invention.

FIG. 5 is a block diagram that indicates a semiconductor integrated circuit device according to the second embodiment of the invention.

As shown in FIG. 5, in the second embodiment, in the case where there are a plurality of fuse arrays 25 of the fuse circuit, a sense amplifier circuit 27 is shared by the plurality of fuse cell arrays 25. Accordingly, the number of the sense amplifier circuits 27 is reduced and the layout area of the fuse circuit is decreased.

One example of sharing is to adopt a multiple-bit line for the bit line, for example, a double bit line comprising local bit lines LBL and a global bit line ZGBL is used. The local bit lines LBL are arranged in the fuse cell arrays 25, respectively, and the global bit line ZGBL is arranged across a plurality of fuse cell arrays 25-1 to 25-3. The sense amplifier circuit 27 is connected to global bit line ZGBL. The global bit line ZGBL is connected to local bit lines LBL via column selectors 29.

By arranging the global bit line ZGBL across the plurality of fuse cell arrays 25-1 to 25-3, the sense amplifier circuit 27 can be shared by the plurality of fuse cell arrays 25-1 to 25-3. Therefore, the layout area of the fuse circuit 15 can be decreased.

In addition, as an example of proper use of the fuse cell array 25, the fuse cell array 25 is properly used in accordance with the type of information to be stored. In the present example, test ROM is stored for the first fuse cell array 25-1, block redundancy information is stored for the second fuse cell array 25-2, and column redundancy information is stored for the third fuse cell array 25-3.

The test ROM is to set test-inhibition at the time of shipment from plant. The block redundancy carries out replacing for each block. The block redundancy information includes, for example, a failure block address. The column redundancy carries out replacing for each column as described above. The column redundancy information includes, for example, a failure column address.

As described above, in accordance with the type of information to be stored, the fuse cell array 25 may be properly used. One example of the advantages achieved by this is that desired information can be easily read from the fuse circuit, and it becomes difficult to erroneously read data from the fuse circuit.

For example, in the case where the test ROM is read, it is enough to select the first fuse cell array 25-1. The information read from the first memory cell array 25-1 is the test ROM. Needless to say, it is also possible to store various types of information in one fuse cell array 25-1. For example, it is possible to store the test ROM and redundancy information in one fuse cell array 25-1 as well. However, a storage place must be made precisely correspondent to stored information in such a manner that addresses from "0 . . . 000" to "0 . . . 100" of the fuse cell array 25-1 are correspondent to the test ROM, and addresses from "0 . . . 101" to "1 . . . 000" are correspondent to the redundancy information. This is troublesome. In this point, if the test ROM is stored in the first fuse cell array 25-1 and the redundancy information is stored in fuse cell arrays other than the first fuse cell array 25-1, the test ROM can be read only by selecting the first fuse cell array 25-1, and this is simple.

Further, the test ROM is, for example, used before shipment but not used after shipment. When the test ROM is read in the market, products would make malfunction in the market. Therefore, the test ROM is stored in the first fuse cell array 25-1, and after shipment, the first fuse cell array 25-1 is use-inhibited. Consequently, the test ROM becomes difficult to be read in the market.

For the redundancy information as well, it is suggested to change fuse cell arrays to be stored in accordance with the type of redundancy information. For example, circuits which are enabled/disabled by the block redundancy information differ from circuits which are enabled/disabled by the column redundancy information. For example, in the case where the block redundancy information is erroneously transmitted to the circuits enabled/disabled by the column redundancy information, the circuit naturally malfunctions. Therefore, as described above, the storage place and the stored information must be made precisely correspondent to each other. In this point, storing the block redundancy information in the second fuse cell array 25-2 and the column redundancy information in the third fuse cell array 25-3 enables reading the block redundancy information only by selecting the second fuse cell array 25-2, and in the same manner, the column redundancy information can be read only by selecting the third fuse cell array 25-3.

In addition, depending on the number and distribution of defective memory cells, there are cases in which remedy is completed only by column redundancy or remedy is completed only by block redundancy in chips. In such a case, unused fuse cell arrays are generated. In this case, unused fuse cell arrays may be use-inhibited after shipment. This eliminates different redundancy information from being erroneously read.

Third Embodiment

A third embodiment of the invention is an example related to a fuse cell decoding system.

Figure 6:
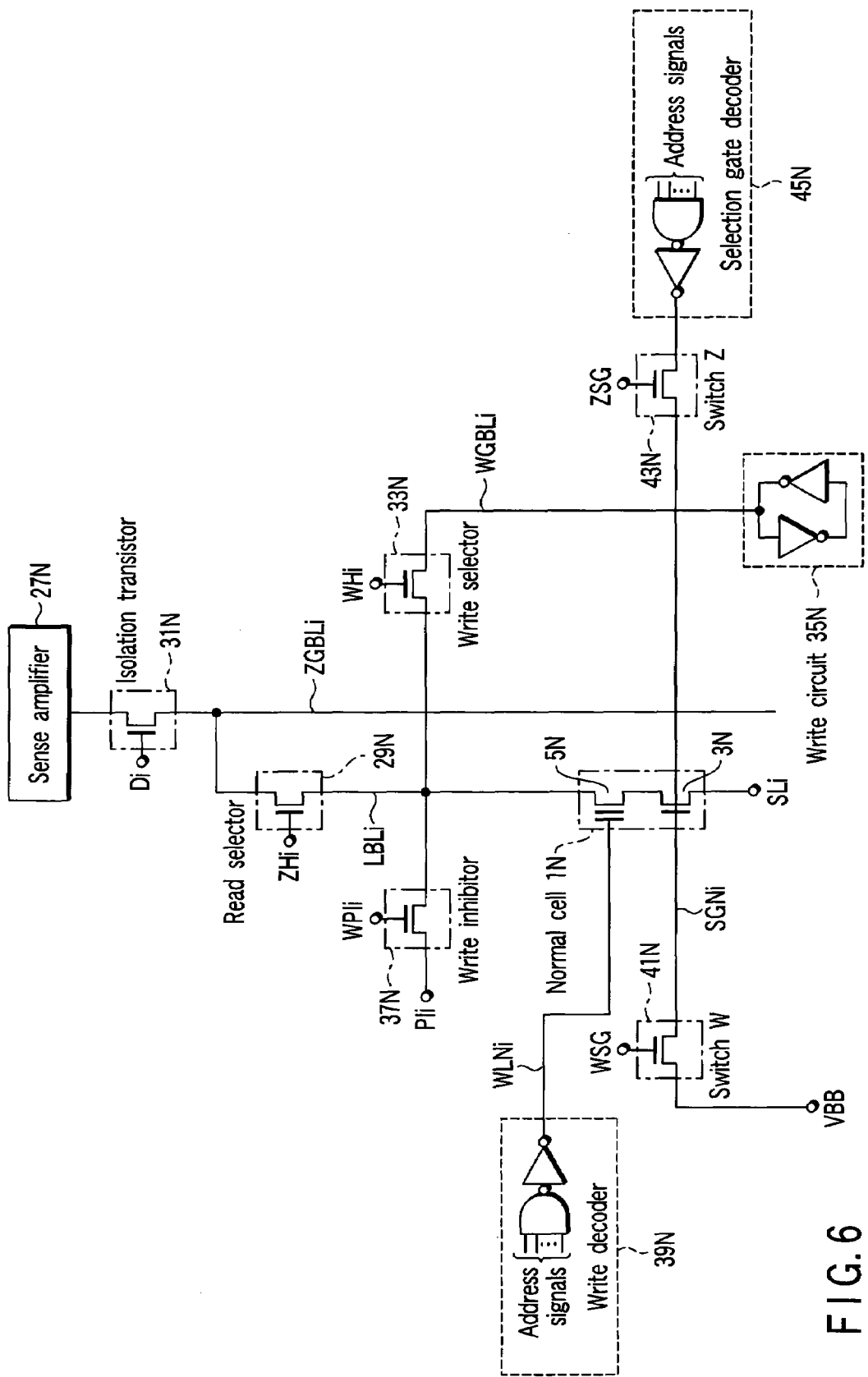
FIG. 6 is a circuit diagram that indicates one example of a normal cell and its peripheral circuit which a semiconductor integrated circuit device according to a third embodiment of the present invention possesses.
Figure 7:
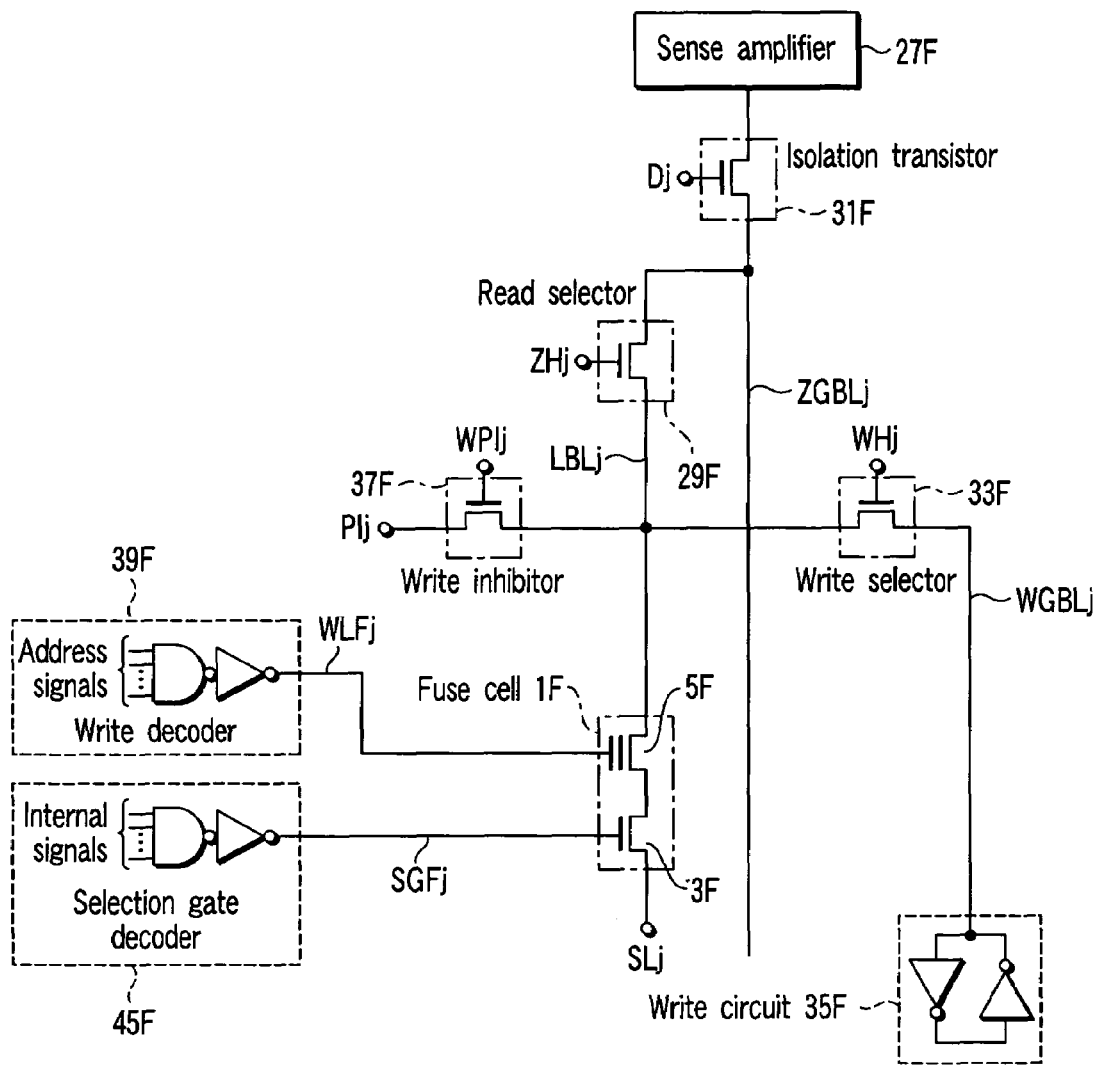
FIG. 7 is a circuit diagram that indicates one example of a fuse cell and its peripheral circuit which the semiconductor integrated circuit device according to the third embodiment of the invention possesses.

FIG. 6 is a circuit diagram that indicates one example of a normal cell and its peripheral circuit which a semiconductor integrated circuit device according to the third embodiment of the invention possesses, and FIG. 7 is a circuit diagram that indicates one example of a fuse cell and its peripheral circuit which the semiconductor integrated circuit device according to the third embodiment of the invention possesses.

(Normal Cell)

A normal cell 1N shown in FIG. 6 is integrated, for example, in the memory cell array 13 shown in FIG. 3. Note that, in FIG. 6, reference symbol "N" denotes "normal" and indicates that the cell is a normal cell and the peripheral circuit is a peripheral circuit of the normal cell.

The normal cell 1N is a 2-transistor type memory cell and has a selection transistor 3N and a cell transistor 5N. A source of the selection transistor 3N is connected to a source line SLi and a drain of the selection transistor 3N is connected to a source of the cell transistor 5N. A drain of the cell transistor 5N is connected to a local bit line LBLi.

The local bit line LBLi is connected to a read global bit line ZGBLi via a read selector 29N. The read global bit line ZGBLi is connected to a sense amplifier circuit 27N via an isolation transistor 31N. To a gate of read selector 29N, a read column select signal ZHi is supplied. In the case where the read column select signal ZHi becomes, for example, the "H" level at the time of reading operation, the read selector 29N turns on, and the local bit line LBLi is selected. Conversely, in the case where the read column select signal ZHi becomes, for example, the "L" level, the read selector 29N turns off, and the local bit line LBLi is not selected. The isolation transistor 31N is a high voltage-resistant transistor, and an isolation signal Di is supplied to the gate of the transistor. The isolation signal Di becomes the "L" level at the time of operation using high voltage, for example, at the time of erasing operation and write operation, and turns off the isolation transistor 31N. Turning off the isolation transistor 31N prevents high voltage from being applied to the sense amplifier circuit 27N. The sense amplifier circuit 27N amplifies the data read to the read global bit line ZGBLi.

The local bit line LBLi is further connected to a write global bit line WGBLi via a write selector 33N. The write global bit line WGBLi is connected to a write circuit 35N. A write column select signal WHi is supplied to a gate of the write selector 33N. In the case where the write column select signal WHi becomes, for example, the "H" level at the time of write operation, the write selector 33N turns on, and the local bit line LBLi is selected. Conversely, in the case where the write column select signal WHi becomes, for example, the "L" level, the write selector 33N turns off, and the local bit line LBLi is not selected. The write circuit 35N is a latch circuit which latches write data. The write data is given, for example, from an input/output circuit to the write circuit 35N.

The local bit line LBNLi is further connected to a write inhibitor 37N. The write inhibitor 37N gives a write inhibit voltage PIi to the local bit line LBLi. To a gate of the write inhibitor 37N, a write inhibit select signal WPIi is supplied. When the write selector 33N turns off at the time of write operation, the write inhibit select signal WPIi becomes, for example, the "H" level and turns on the write inhibitor 37N. As the write inhibitor 37N turns on, the write inhibit voltage PIi is supplied to the non-selected local bit line LBLi. The write inhibit voltage PIi may be any voltage which does not change the threshold value of the cell transistor 5N, and for example, may be the voltage when data "1" is written. In this example, it is 0V.

The gate of the cell transistor 5N is connected to a word line WLNi. The word line WLNi is connected to a write decoder 39N. The write decoder 39N decodes address signals at the time of write operation and decides select/non-select of the word line WLNi. When the potential of the word line WLNi becomes the "H" level, for example, a write potential VPP (for example, 12V), the word line WLNi is selected, and conversely, when the potential of the word line WLNi becomes the "L" level, for example, 0V, the word line WLNi is not selected.

The gate of the selection transistor 3N is connected to a selection gate line SGNi. The selection gate line SGNi is connected to a switch W circuit 41N. The switch W circuit 41N gives a negative potential VBB to the selection gate line SGNi. The selection gate line SGNi is further connected to a switch Z circuit 43N. The switch Z circuit 43N is connected to a selection gate decoder 45N. A write signal WSG is supplied to a gate of the switch W circuit 41N, and a read signal ZSG is supplied to a gate of the switch Z circuit 43N.

The write signal WSG becomes the "L" level at the time of read operation, and the read signal ZSG becomes the "H" level. The switch W circuit 41N turns off and the switch Z circuit 43N turns on. The selection gate line SGNi is connected to the selection gate decoder 45N. The selection gate decoder 45N decodes the address signal at the time of read operation and decides select/non-select of the selection gate line SGNi. When the potential of the selection gate line SGNi becomes the "H" level, the selection gate line SGNi is selected and conversely, when the potential of the selection gate line SGNi becomes the "L" level, the selection gate line SGNi is not selected.

At the time of write operation, the write signal WSG becomes the "H" level, and the read signal ZSG becomes the "L" level. The switch W circuit 41N turns on and the switch Z circuit 43N turns off. To the selection gate line SGNi, a negative potential VBB, for example, −8V is supplied.

At the time of erasure operation, both the write signal WSG and the read signal ZSG become the "L" level. Both the switch W circuit 41N and the switch Z circuit 43N turn off. The selection gate line SGNi is floated.

Figure 8:
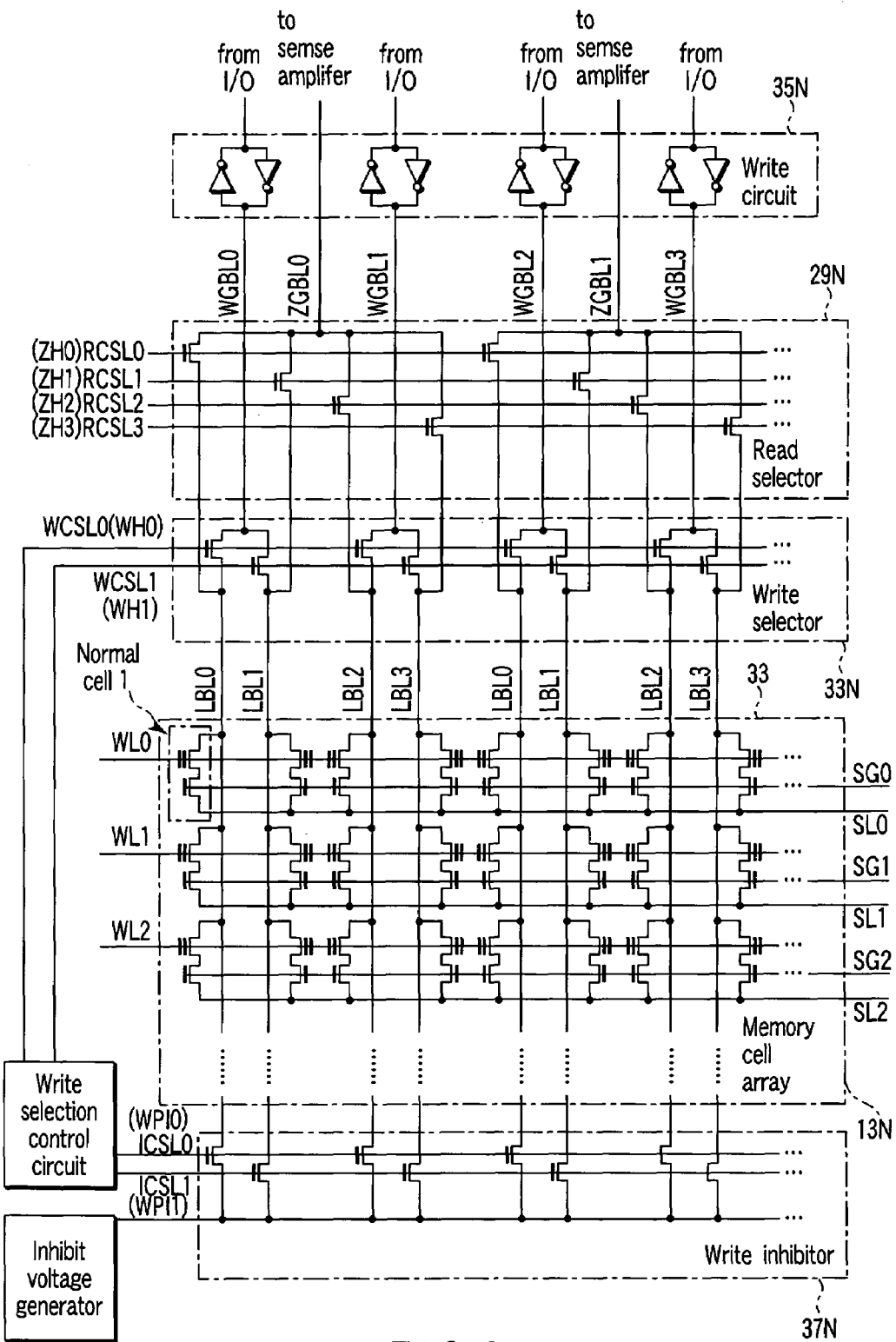
FIG. 8 is a circuit diagram that indicates one example of a memory cell array shown in FIG. 6 and one example of its peripheral circuit.
Figure 9:
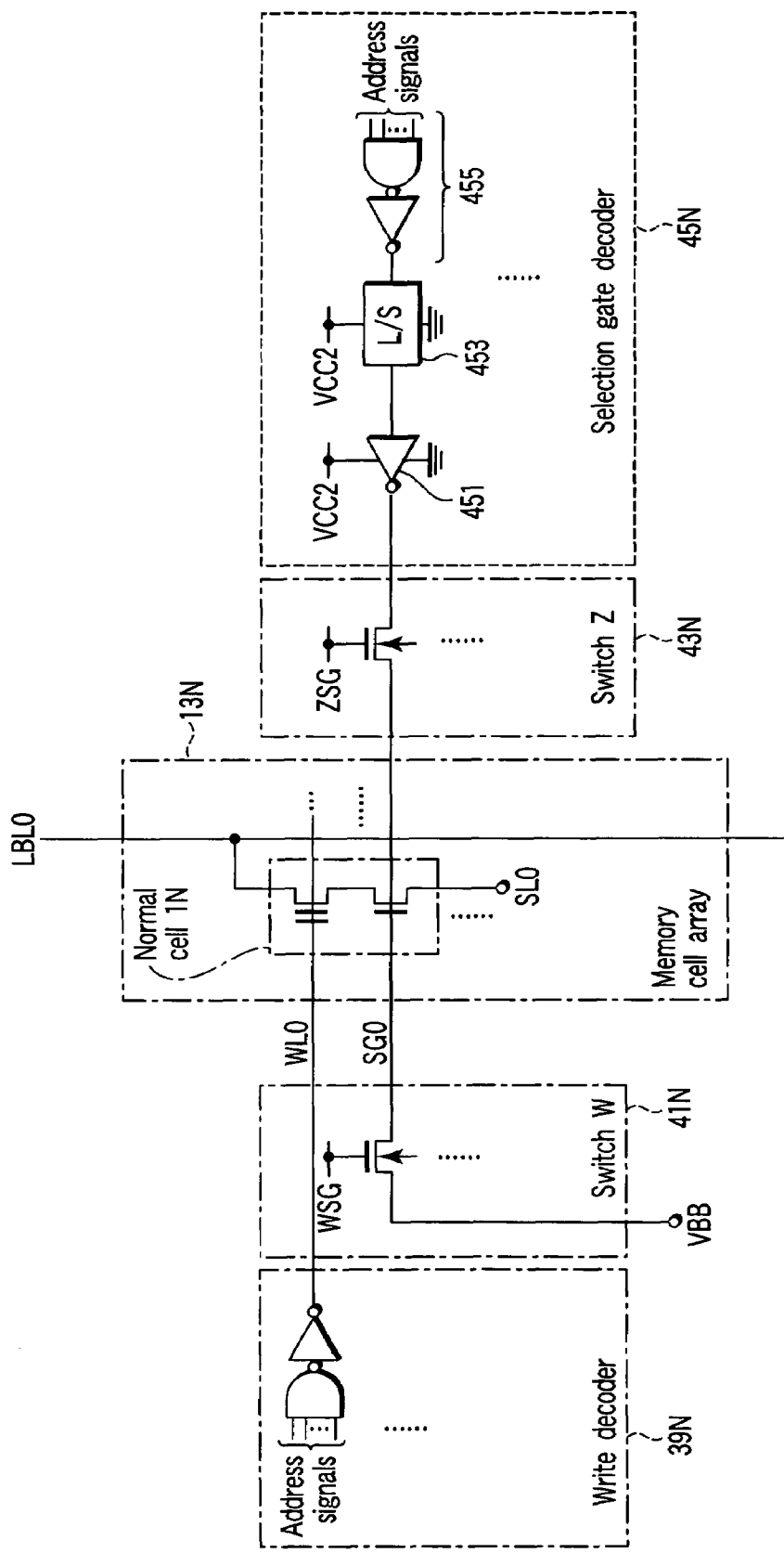
FIG. 9 is a circuit diagram that indicates one example of the memory cell array shown in FIG. 6 and one example of the peripheral circuit.

FIGS. 8 and 9 are circuit diagrams that indicate one example of the memory cell array 13 and one example of its peripheral circuit. FIG. 8 shows a column-based peripheral circuit of the peripheral circuits, while FIG. 9 shows a row-based peripheral circuit of the peripheral circuits. In FIGS. 8 and 9, like reference characters are designated to like or corresponding portions in FIG. 6 and the explanation thereof is omitted.

(Fuse Cell)

A fuse cell 1F shown in FIG. 7 is integrated, for example, in the fuse circuit 15 shown in FIG. 3. Note that, in FIG. 7, reference symbol "F" denotes "fuse" and indicates that it is a fuse cell and a peripheral circuit of the fuse cell.

As shown in FIG. 7, the fuse cell 1F and its peripheral circuit are substantially similar to the normal cell 1N and its peripheral circuit. Consequently, like reference characters are designated to like or corresponding portions and different portions only are explained.

The fuse cell 1F and the peripheral circuit differ from the normal cell 1N and the peripheral circuit in, in particular, a decode system of a selection gate decoder 45F and a configuration of the selection gate decoder 45F.

The selection gate decoder 45F decodes not an address signal but an internal signal. The internal signal is a signal generated by a counter circuit disposed inside the integrated circuit after charging of power supply is detected. The fuse circuit 15 is a circuit which begins operation immediately after the power supply is charged. When the power supply is charged into the integrated circuit, the fuse circuit 15 operates, and, for example, stored failure addresses are read. The read failure addresses are latched, for example, in a latch circuit. The latch circuit is disposed in, for example, in the failure address storage circuit 19 shown in FIG. 4. For example, failure addresses read from the fuse circuit 15 are latched to the latch circuit. Accordingly, the fuse circuit 15 can be operated only once immediately after the power supply is charged, and there is no need to access the fuse circuit 15 while it is in operation. At the time of reading immediately after the power supply is charged, the fuse cell 1F is accessed. It is the internal signal that decides select/non-select of the fuse cell 1F at the time of this access.

In addition, the selection gate decoder 45N which selects the normal cell 1N utilizes a step-up potential VCC2 as shown in FIG. 9. For example, a logic circuit 455 operates at a power supply potential VCC and outputs a decode signal with the "H" level set as the power supply potential VCC. The "H" level of the decode signal is shifted from the power supply potential VCC to the step-up potential VCC2 in a level shift circuit 453, and the level-shifted decode signal is outputted from a buffer circuit 451. Consequently, the potential of the "H" level of the read signal ZSG is the step-up potential VCC2. The step-up potential VCC2 is generated by boosting the power supply potential VCC in the integrated circuit by the use of a step-up circuit disposed in the integrated circuit.

However, the selection gate decoder 45F which selects the fuse cell 1F does not utilize the step-up potential VCC2. This is because immediately after the power supply is charged, the step-up circuit is not sufficiently operated and the step-up voltage VCC2 is not generated. Consequently, the selection gate decoder 45F utilizes the power supply potential VCC without using the step-up potential VCC2.

Furthermore, the output of the selection gate decoder 45F is directly supplied to a selection gate line SGFj without the intermediary of the switch Z circuit. One of the reasons why the switch Z circuit is omitted is that the reading operation from the fuse circuit 15 is only once immediately after the power supply is charged in, and thereafter, the switch Z circuit is not accessed. That is, the fuse cell 1F does not need to enable the reading operation each time by the use of the read signal ZSG. Consequently, the switch Z circuit can be omitted from the peripheral circuit of the fuse cell 1F.

In this way, by changing the decode system of the fuse cell 1F to the decode system of the normal cell 1F, the optimum decode system can be achieved for the fuse cell 1F and the normal cell 1N, respectively.

Specifically, in the fuse cell 1F, not the address signal given from the outside of the integrated circuit but the internal signal generated by the circuit which operates immediately after the power supply is charged, for example, by the counter circuit is decoded and accessed. As a result, immediately after the power supply is charged in, the fuse cell 1F is automatically accessed and data is read.

In addition, in the selection gate decoder 45F, no step-up potential VCC2 is used. Therefore, it is possible to quickly access the fuse cell 1F without waiting that the step-up circuit begins to thoroughly operate immediately after the power supply is charged in.

Furthermore, from the peripheral circuit of the fuse cell 1F, the switch Z circuit is omitted. This makes is possible to simplify the circuit configuration of the fuse circuit 15.

Fourth Embodiment

A fourth embodiment of the invention is an example related to the layout of a sense amplifier circuit.

FIG. 10 is a circuit diagram that indicates a semiconductor integrated circuit unit according to a reference example of the fourth embodiment of the invention.

As shown in FIG. 10, when the sense amplifier circuit 27 is connected to each bit line BL (BL0 to BL3), the layout pitch of the sense amplifier circuit 27 does not match the layout pitch of the bit line BL. Therefore, the bit line BL must be bent at the end of the memory cell array. If the bit line BL is bent, the bent region must be secured at the end of the memory cell array. Assuming that "h" denotes the length of the bent region, the size of the memory cell array is increased by the length "h".

FIG. 11 is a circuit diagram that shows a semiconductor integrated circuit unit according to the fourth embodiment of the invention.

As shown in FIG. 11, in the fourth embodiment, the sense amplifier circuit 27 is not connected to each bit line BL (BL0 to BL3) but the sense amplifier circuit 27 is connected at intervals of several bit lines BL, for example, at intervals of N lines. N is a natural number equal to and greater than 1.

In the present example, the sense amplifier circuit 27 is connected every other bit line BL. Specifically, the sense amplifier circuits 27 are connected to the even-number-th bit lines BL0, BL2, BL4, BL6, . . . . The odd-number-th bit lines BL1, BL3, BL5, BL7, . . . are formed in the memory cell array, but are not connected to the sense amplifier circuits 27. In this example, the layout pitch P-BL of the bit line BL differs in the layout pitch P-S/A of the sense amplifier circuit 27. That is, in the example, the pitch P-BL is ½ the pitch P-S/A.

Memory cells which are connected to the odd-number-th bit lines BL1, BL3, BL5, BL7, . . . are formed in the memory cell array. However, because these memory cells are not connected to the sense amplifier circuits 27, they do not function as memory cells. They are, so to speak, dummy memory cells.

According to the fourth embodiment, because the sense amplifier circuits 27 are connected to every other several bit lines BL, the layout pitch of the sense amplifier circuit 27 substantially matches the layout pitch of the bit line BL connected to the sense amplifier circuit 27. Consequently, there is no need to bend the bit line BL at the end of the memory cell array. Therefore, there is no need to secure a bent region at the end of the memory cell array, and the size of the memory cell array can be reduced as compared to the reference example shown in FIG. 10.

The semiconductor integrated circuit device according to the fourth embodiment can be applied to the fuse circuit 15. The fuse circuit 15 is not expected to have a large-scale storage capacity as expected for a memory cell array in which normal cells are integrated. That is, even if, for example, not more than one half the memory cells formed in the memory cell array are intended to be used, the storage capacity can be satisfactorily secured.

Furthermore, since the fuse cell circuit 15 is not the integrated circuit which the user uses, the layout area is desired to be minimized. Thus, applying the semiconductor integrated circuit device according to the fourth embodiment is applied to the fuse circuit 15 can reduce the size of the memory cell array, serving to reduce the layout area of the fuse circuit 15.

The advantage of establishing dummy memory cells is that the minimum size of the memory cell array (fuse cell array) of the fuse cell circuit 15 can be brought to be same as the minimum size of the memory cell array in which normal cells are integrated. The fuse cell array is formed by the same manufacturing process as memory cell arrays in which normal cells are integrated. When fuse cell arrays are formed by the same manufacturing process, either of the cell arrays may be incompletely formed when the minimum sizes differ. This is attributed to incomplete exposure of patterns of either cell array in a lithography process. To be simple, when the exposure conditions are optimized to patterns with smaller minimum size (memory cell array in which normal cells are formed), exposure of the patterns with larger minimum size (fuse cell array) becomes incomplete. Conversely, when the exposure conditions are optimized to the patterns with larger minimum size, exposure of the patterns with smaller minimum size is incomplete. To solve this problem, patterns of the fuse cell array should be made same as patterns of the memory cell array on which normal cells are formed in order to match the minimum sizes. If the minimum sizes are matched, the exposure conditions can be optimized to patterns of the fuse cell array and patterns of the memory cell array on which normal cells are formed, respectively, and both patterns can be completely exposed.

(First Modification)

Figure 12:
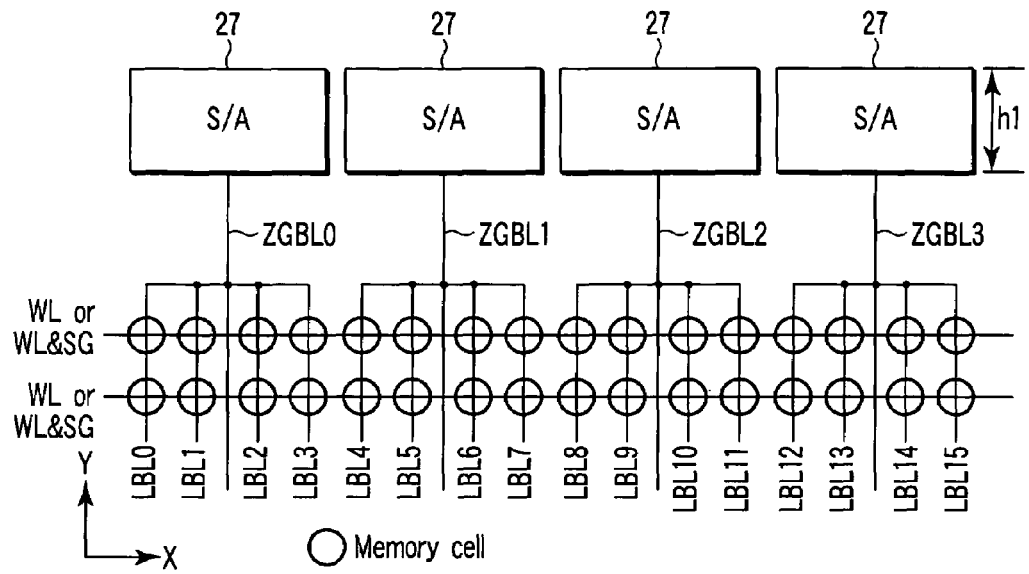
FIG. 12 is a circuit diagram that indicates a semiconductor integrated circuit device according to a first modification of the fourth embodiment of the invention.

FIG. 12 is a circuit diagram that indicates a semiconductor integrated circuit device according to a first modification of the fourth embodiment of the invention.

As shown in FIG. 12, since in the case of double bit lines, the global bit lines GBL, for example, the read global bit lines ZGBL are disposed at intervals of several pieces of local bit line LBL, the layout pitch of the sense amplifier circuit 27 may match the layout pitch of the read global bit line ZGBL.

As is the case of the first modification, even when the memory cell array of the fuse circuit 15 is designed to have double bit lines, no bit line BL has to be bent at the end of the memory cell array. Therefore, there is no need to secure any bent region at the end of the memory cell array, and as compared to the reference example shown in FIG. 10, the size of the memory cell array can be reduced. Needless to say, the patterns of the memory cell array of the fuse circuit 15 can be made same as the patterns of the memory cell array in which normal cells are integrated.

(Second Modification)

Figure 13:
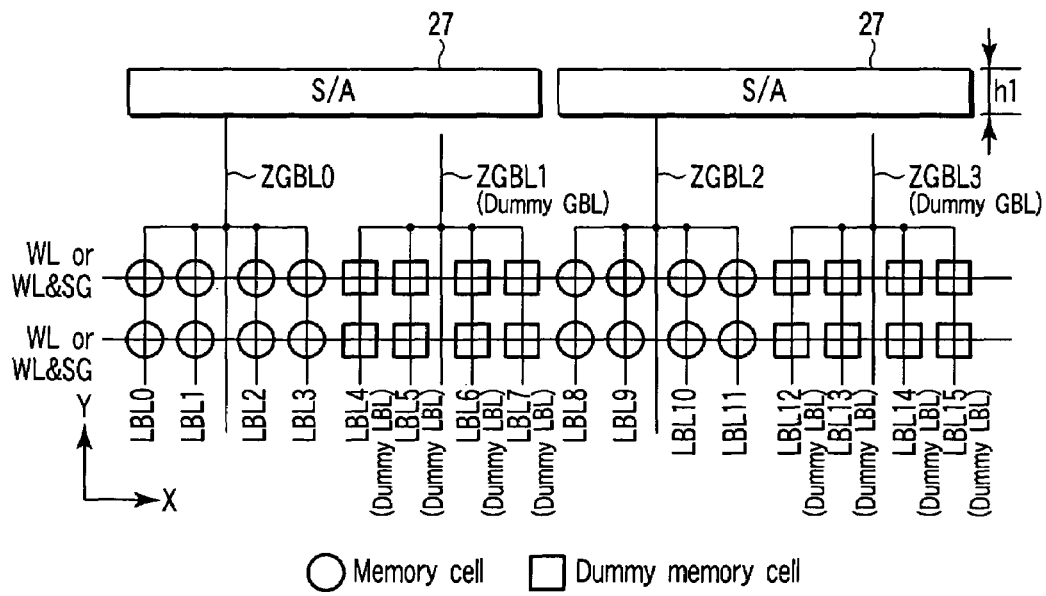
FIG. 13 is a circuit diagram that indicates a semiconductor integrated circuit device according to a second modification of the fourth embodiment of the invention.

FIG. 13 is a circuit diagram that indicates a semiconductor integrated circuit device according to a second modification of the fourth embodiment of the invention.

As shown in FIG. 13, dummy memory cells may be set to the first modification. The sense amplifier circuit 27 is connected at intervals of several pieces of read global bit line ZGBL. In the present example, even-number-th read global bit lines ZGBL0, ZGBL2, . . . are connected to the sense amplifier circuit 27, and odd-number-th read global bit lines ZGBL1, ZGBL3, . . . are not connected to the sense amplifier circuit 27. The memory cells connected to the odd-number-th read global bit lines ZGBL1, ZGBL3, . . . become dummy memory cells.

Also in the second modification, advantages same as the fourth embodiment as well as the first modification of the fourth embodiment can be obtained. Furthermore, according to the second modification, as compared to the first modification, the length "h1" of the sense amplifier circuit 27 along the direction in which the read global bit line ZGBL of, in particular, the sense amplifier circuit 27 extends (Y-direction) can be reduced, and the layout area of the fuse circuit 15 can be still further decreased.

(Memory Cell Structure)

Figure 14:
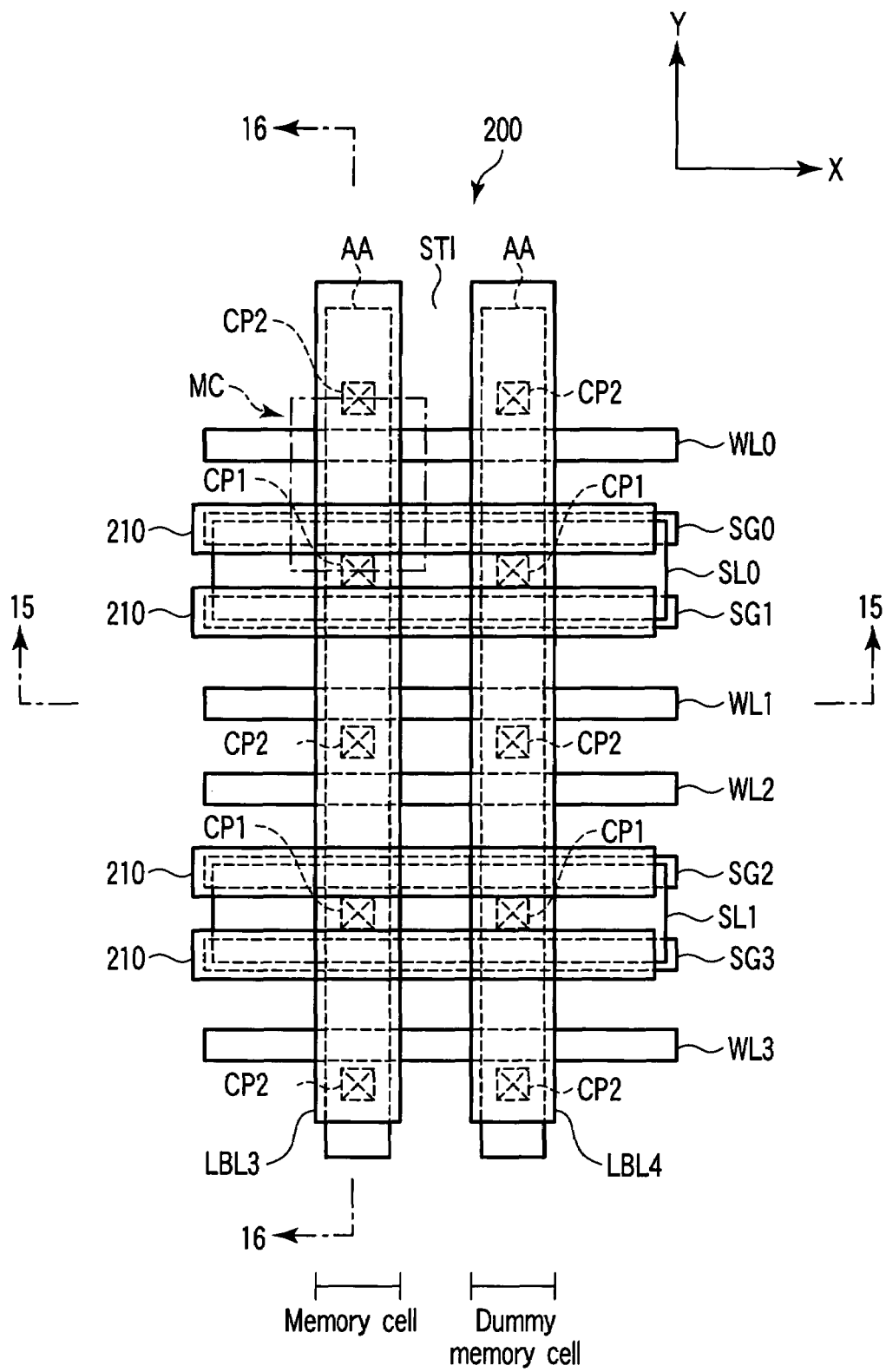
FIG. 14 is a plan view that indicates one example of a memory cell array of the semiconductor integrated circuit device according to the fourth embodiment of the invention.

FIG. 14 is a plan view that indicates one example of a memory cell array of the semiconductor integrated circuit device according to the fourth embodiment of the invention. Note that, in FIG. 14, the read global bit line ZGBL and the write global bit line WGBL are omitted.

As shown in FIG. 14, in a semiconductor substrate 200, a plurality of element regions AA of a stripe shape along the Y-direction are formed along the X-direction that crosses in the Y direction, for example, that crosses at right angles. Word lines WL0 to WL3 and selection gate lines SG0 to SG3 of a stripe shape along the X-direction are formed so as to stride over the plurality of element regions AA. In a region where the word lines WL0 to WL3 and the element region AA cross each other, cell transistor 5 (not shown) are formed, and in a region where the selection gate lines SG0 to SG3 and the element region AA cross each other, selection transistors 3 (not shown) are formed. In the region where the word lines WL0 to WL3 and the element region AA cross each other, a floating gate FG (not shown) separated for every cell transistor 5 is formed.

On the two adjacent selection gate lines SG0 and SG1 as well as SG2 and SG3, a source line SL of a stripe shape along the X-direction is formed. The source line SL is electrically connected to a source region of the selection transistor 3 via a contact plug CP1. Local bit lines LBL0 and LBL1 of a stripe shape along the Y direction are formed so as to substantially overlap the element region AA. The local bit lines LBL0 and LBL1 are connected to a drain region of each cell transistor via a contact plug CP2. In the region right above each of the selection gate lines SG0 to SG3, a metal wiring layers 210 of a stripe shape along the X-direction is formed. The metal wiring layer 210 functions as a shunt wiring of the selection gate lines SG0 to SG3 and is connected to the selection gate lines SG0 to SG3 by contact plugs in a region (not shown). A metal wiring layer of a stripe shape along the Y direction is formed on an upper layer level than the wiring. The metal wiring layer functions as the read global bit line ZGBL and the write global bit line WGBL but in FIG. 14, illustration is omitted.

Figure 15:
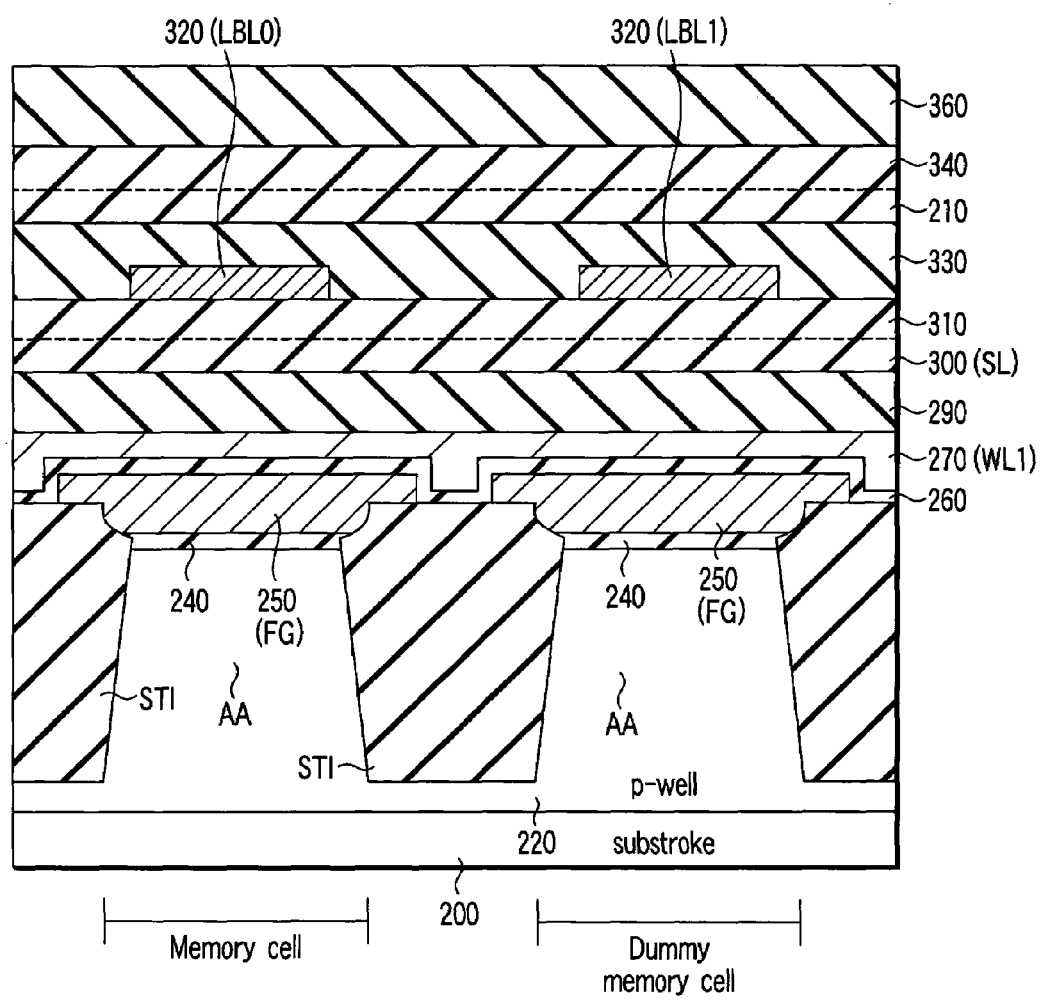
FIG. 15 is a cross-sectional view taken along the line 15-15 in FIG. 14.

Then, the cross-sectional structure of the memory cell array will be described with reference to FIGS. 15 and 16. FIG. 15 is a cross-sectional view taken along the line 15-15 in FIG. 14, and FIG. 16 is a cross-sectional view taken along the line 16-16 in FIG. 14.

Figure 16:
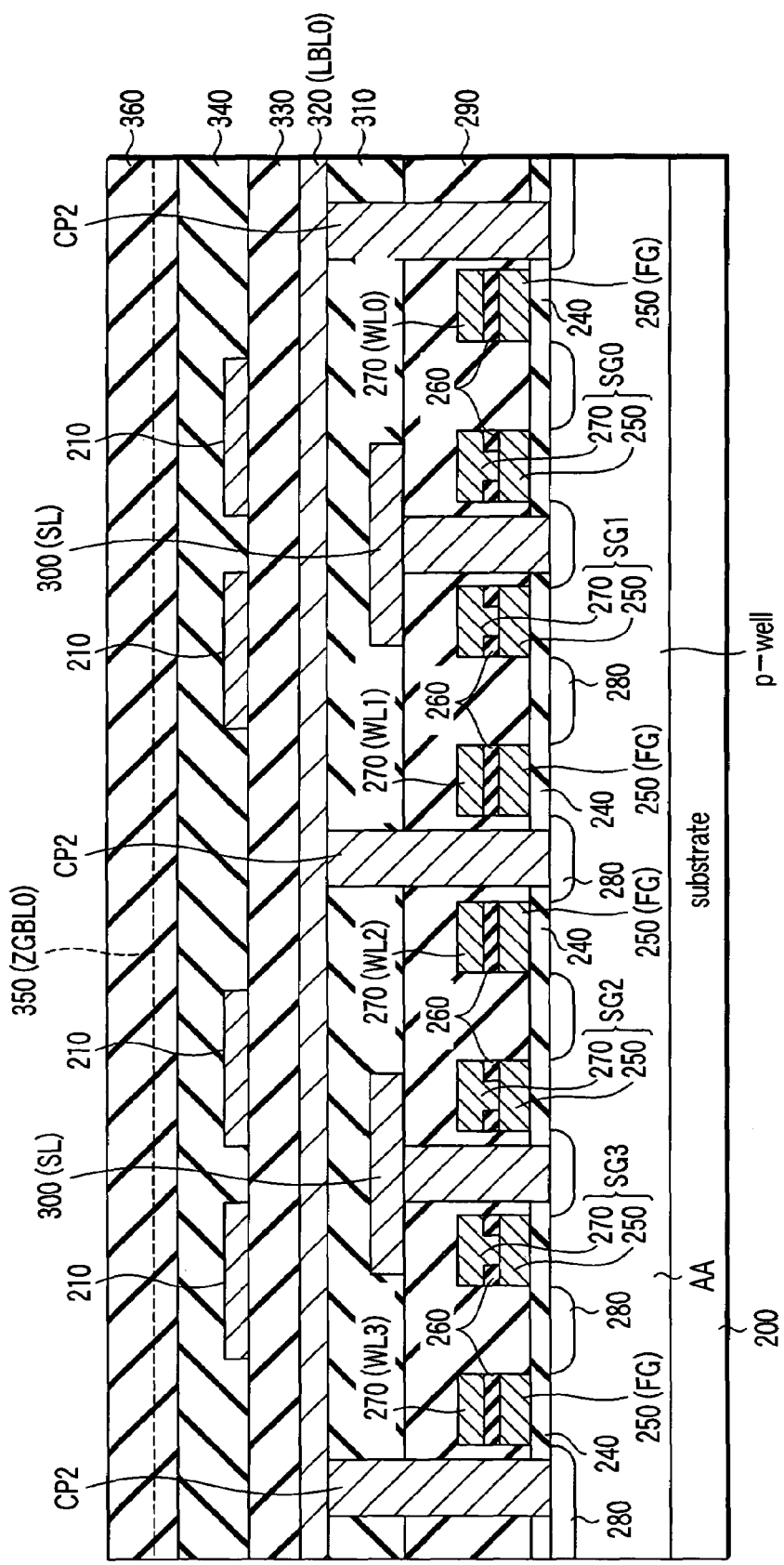
FIG. 16 is a cross-sectional view taken along the line 16-16 in FIG. 14.

As shown in FIGS. 15 and 16, a p-type well region 220 is formed in a surface region of a semiconductor substrate 200. In the p-type well region 220, an element isolated region STI is formed. A region whose periphery is surrounded by the element isolated region STI becomes an element region AA. On the element region AA of the semiconductor substrate 200, a gate insulation film 240 is formed, and on the gate insulation film 240, gate electrodes of the cell transistor 5 and selection transistor 3 are formed. The gate electrodes of the cell transistor 5 and selection transistor 3 have a polycrystal silicon layer 250 formed on the gate insulation film 240, an inter-gate insulation film 260 formed on the polycrystal silicon layer 250, and a polycrystal silicon layer 270 formed on the inter-gate insulation film 260. The inter-gate insulation film 260 is formed by, for example, a silicon oxide film, or a ON film, a NO film, or a ONO film, which is of a lamination structure of a silicon oxide film and a silicon nitride film. Note that, as shown in FIG. 15, the polycrystal silicon layer 250 is separated between the adjacent element regions AA in the cell transistor 5, and functions as a floating gate FG. The polycrystal silicon layer 270 functions as a control gate and is connected to a word line WL. The word line WL is connected in common between the adjacent element regions AA. In the selection transistor 3, the polycrystal silicon layer 250 is connected in common between the adjacent element regions AA. In addition, part of the inter-gate insulation film 260 is removed, and the polycrystal silicon layer 250 is electrically connected to the polycrystal silicon layer 270. The polycrystal silicon layers 250 and 270 are connected to the selection gate line SG. In the selection transistor 3 as well, the polycrystal silicon layer 270 is connected in common across the adjacent element regions AA. An impurity diffusion layer 280 is formed in the surface of the semiconductor substrate 200 located between adjacent gate electrodes. The impurity diffusion layer 280 is shared by adjacent transistors.

Note that, a memory cell and a dummy cell which include the cell transistor 5 and the selection transistor 3 are formed under the following relationship. That is, adjacent memory cells (or dummy memory cells) have selection transistors 3 or cell transistors 5 adjoined. In other words, adjacent parts share the impurity diffusion layer. Therefore, in the case where the selection transistors 3 are adjacent to each other, the two adjacent memory cells (or dummy memory cells) are disposed symmetrically about the impurity diffusion layer 280 shared by the two selection transistors 3.

On the semiconductor substrate 200, an interlayer insulation film 290 is formed so as to cover the cell transistor 5 and the selection transistor 3. In the interlayer insulation film 290, a contact plug CP1 that reaches the impurity diffusion layer (source region) 280 shared by the two selection transistors 3 is formed. On the interlayer insulation film 290, a metal wiring layer 300 connected to the contact plug CP1 is formed. The metal wiring layer 300 functions as a source line SL.

On the interlayer insulation film 290, an interlayer insulation film 310 is formed so as to cover the metal wiring layer 300. A contact plug CP2 which reaches the impurity diffusion layer (drain region) 280 of the memory cell transistor 5 is formed through the interlayer insulation film 290 from the surface of the interlayer insulation film 310. On the interlayer insulation film 310, a metal wiring layer 320 connected in common to a plurality of contact plugs CP2 is formed. The metal wiring layer 320 functions as local bit lines LBL0, LBL1.

On the interlayer insulation film 310, an interlayer insulation film 330 is formed so as to cover the metal wiring layer 320. On the interlayer insulation film 330, a metal wiring layer 210 is formed. The metal wiring layer 210 functions as a shunt wiring of the gate of the selection transistor 3. Consequently, in an unillustrated region, a contact plug is formed which reaches the gate electrode 270 of a selection transistor ST from the surface of the interlayer insulation film 330. The gate electrode 270 of the selection transistor 3 is electrically connected to the metal wiring layer 210 via the contact plug.

On the interlayer insulation film 330, an interlayer insulation film 340 is formed so as to cover the metal wiring layer 210. On the interlayer insulation film 340, a metal wiring layer 350 is formed. The metal wiring layer 350 functions as the read global bit line ZGBL0 in FIG. 16. On the interlayer insulation film 340, an interlayer insulation film 360 is formed so as to cover the metal wiring layer 350.

As shown in FIGS. 14 to 16, the memory cell and dummy memory cell have the same structure. In the second modification, no dummy memory cell is set, and therefore, the dummy memory cell should be used as a memory cell.

Fifth Embodiment

Next, explanation will be made on a semiconductor integrated circuit device according to a fifth embodiment of the invention with reference to FIG. 17. The embodiment relates to a system LSI equipped with the semiconductor integrated circuit device according to the first to fourth embodiments.

Figure 17:
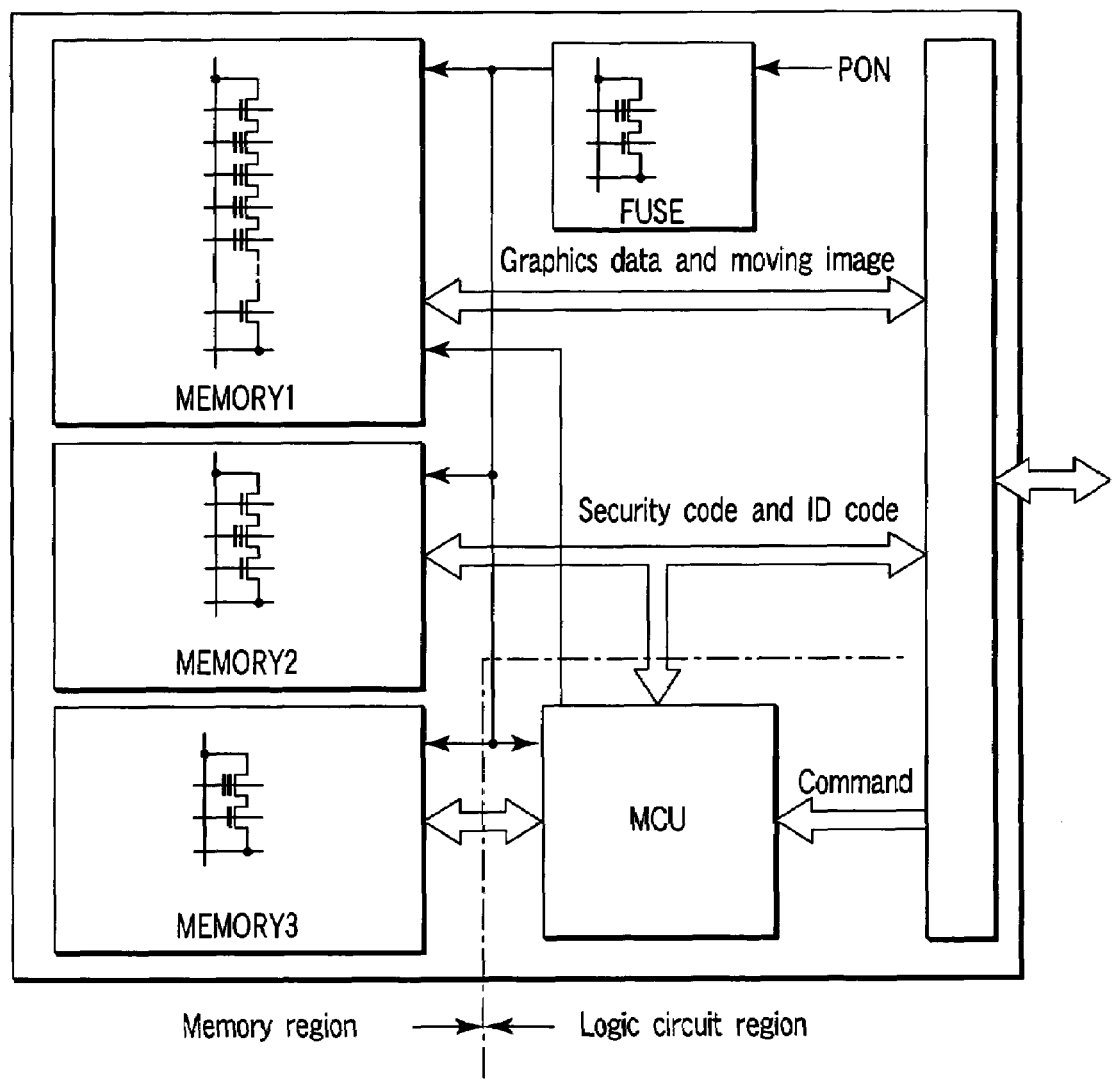
FIG. 17 is a block diagram that indicates a semiconductor integrated circuit device according to a fifth embodiment of the invention.

FIG. 17 is a block diagram that indicates the semiconductor integrated circuit device according to the fifth embodiment of the invention.

As shown in FIG. 17, the fifth embodiment comprises an NAND type flash memory (MEMORY1), a 3Tr-NAND type flash memory (MEMORY2), a 2Tr flash memory (MEMORY3), an MCU, an input/output circuit, and a fuse circuit (FUSE) which are formed on the same semiconductor substrate.

The NAND type flash memory (MEMORY1) is used as a storage memory that stores graphics data and moving image data.

The 3-Tr-NAND type flash memory (MEMORY2) holds a ID code and a security code for access to the semiconductor integrated circuit unit.

The 2-Tr flash memory (MEMORY3) holds program data to allow the MCU to operate.

The MCU carries out processing on the basis of the program read from the 2TR flash memory in response to various kinds of commands inputted from the outside. In such an event, the MCU accesses directly the 2TR flash memory without intermediary of a static random access memory (SRAM) and the like. Examples of processing carried out by the MCU include compression and decompression of the data inputted to the NAND type flash memory and control of an external device. Furthermore, the MCU reads predetermined data from the 3Tr-NAND type flash memory in the case where the data stored in the NAND type flash memory is accessed from the outside. Then, the MCU collates the read data with the ID code and security code inputted from the outside, and when they coincide, access to the NAND type flash memory is permitted. When access to the NAND type flash memory is permitted, access to the data inside the NAND type flash memory is carried out from the outside (host). That is, the MCU responds to a command received from the outside, triggers the NAND type flash memory, and reads (writes) data.

The input/output circuit controls transmission/reception of signals between the semiconductor integrated circuit unit and the outside.

The fuse circuit has been explained in the first to fourth embodiments and comprises 2-transistor type memory cells as is the case of the 2Tr flash memory.

According to the fifth embodiment, in addition to the advantages described in the first to fourth embodiments, the following advantages can be obtained.

(1) While keeping the manufacturing cost low, multiple kinds of semiconductor memories can be mounted on the same chip.

The cell transistor and the selection transistor which the NAND type flash memory, the 3Tr-NAND type flash memory, 2Tr flash memory, and the fuse circuit possess, respectively, can be formed by the same process. That is, each transistor is formed by the same oxidation step, film-forming step, impurity injection step, and photolithography/etching step. As a result, the gate insulation film, the inter-gate insulation film, the floating gate and control gate of the cell transistor, and the selection gate of the selection transistor are identical among four memories. In this kind of manufacturing method, memory cell arrays of three flash memories and memory cell arrays of the fuse circuit can be formed by the number of steps necessary for forming one flash memory. Consequently, the manufacturing cost of a system LSI having multiple kinds of semiconductor memories mounted thereon can be reduced.

(2) The system LSI can be sophisticated.

The system LSI according to the present embodiment has the NAND type flash memory and 3Tr-NAND type flash memory in addition to the 2Tr flash memory.

Unlike the NAND type flash memory or 3Tr-NAND type flash memory, the 2Tr flash memory uses the positive voltage (for example, 12V) and the negative voltage (for example, −8V) at the time of writing and erasing, but the write inhibit voltage can be set to 0V in the vicinity of the midpoint between the positive and negative voltages. That is, it is easy to apply the write inhibit voltage from the bit line. In addition, by using the positive and negative voltages, the potential difference applied to the gate insulation film of the MOS transistor for use in the decoder is either positive potential (for example, 12V) or negative potential (for example, −8V). Therefore, for the MOS transistor for use in a write decoder which the 2Tr flash memory possesses, those with thinner gate insulation film than MOS transistors for use in a low decoder, which NAND type flash memory or 3Tr-NAND type flash memory possesses, can be used. Accordingly, the write decoder can be miniaturized, and the operating speed of the write decoder can be increased as compared to the low decoder which the NAND type flash memory or 3Tr-NAND type flash memory possesses. Consequently, the operating speed of the 2Tr flash memory can be improved. Further, the random access speed can be increased.

Further, in the present embodiment, program data for allowing the MCU to operate is stored in the 2Tr flash memory. Because the 2Tr flash memory is able to operate at a high speed, the MCU can read data directly from the 2Tr flash memory without an intervention of SRAM and the like. As a result, the SRAM and the like are no longer required, the configuration of the system LSI can be simplified, and the operating speed can be improved.

Furthermore, the 3Tr-NAND type flash memory holds the ID code and security code. These code data are not so large in the data volume itself but are frequently changed and updated. Therefore, the memory which holds these code data is required for a certain level of high-speed operation. In this point, the 3Tr-NAND type flash memory has not as large erase unit as the NAND type flash memory, and the data can be rewritten in units of page. Accordingly, the 3Tr-NAND type flash memory is optimal for holding the above-mentioned code data.

In addition, conventionally, the following controllers are required in order to prevent rewriting from being concentrated to a specific block in the case of an LSI which has a NAND type flash memory. That is, it is a controller to control to, when the address inputted by ware leveling or logic is converted to a physical address or there is any failure in a block, determine the block as a defective block and not to use it any more. However, in the present embodiment, such a controller is not required. This is because the firm ware program that controls blocks in the NAND type flash memory is stored in the 2Tr flash memory and the above control is carried out by the MCU. The MCU should be allowed to carry out the above control by using the time between operations which the MCU must originally carry out (control of the external device, calculation processing for data inputted in the NAND type flash memory). Needless to say, the MCU capacity and the magnitude of throughput which the MCU must originally process are evaluated, and a hardware sequencer and the like may be installed to control the NAND type flash memory in the case of the large throughput.

As described above, the present invention has been explained by referring to several embodiments, but this invention is not limited to each of these embodiments, and in practicing the invention, the present invention can be modified in various ways without departing from the spirit and scope thereof.

In addition, it is possible to independently implement each embodiment, but it is also possible to implement the embodiments by combining them appropriately.

Furthermore, each of the embodiments contains the invention of various stages, and inventions of various stages can be extracted by suitably combining a plurality of constituent features disclosed in each embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor memory circuit including a memory cell array in which normal cells are arranged; and
   a fuse circuit in which fuse cells that store operation information of the semiconductor memory circuit are arranged,
   wherein the fuse cells are independent of the memory cell array, and each of the fuse cells is a 2-transistor type memory cell comprising a cell transistor having a charge storage layer and a selection transistor which selects the cell transistor.

2. The device according to claim 1, wherein the fuse circuit comprises a plurality of fuse cell arrays in which fuse cells are integrated and a sense amplifier which amplifies information read from the plurality of fuse cell arrays, and the sense amplifier is shared by the plurality of fuse cell arrays.

3. The device according to claim 1, wherein the fuse circuit comprises a fuse cell array in which fuse cells are arranged and a sense amplifier which amplifies information read from the fuse cell array, and the fuse cell array has bit lines connected to the sense amplifier and dummy bit lines not connected to the sense amplifier.

4. The device according to claim 3, wherein the bit lines and the dummy bit lines are arranged at a same pitch.

5. The device according to claim 3, wherein minimum sizes of the fuse cell array and the memory cell array are same.

6. The device according to claim 1, wherein the fuse circuit comprises a fuse cell array in which fuse cells are arranged, sense amplifiers which amplify information read from the fuse cell array, bit lines connected to the sense amplifiers, dummy bit lines arranged between the bit lines, and dummy memory cells, the fuse cell connected to the bit lines and the dummy cell connected to the dummy bit lines.

7. The device according to claim 1, wherein the fuse circuit comprises a first local bit line group which includes a plurality of local bit lines, a second local bit line group which includes a plurality of local bit lines, a first global bit line connected to the plurality of local bit lines of the first local bit line group, a second global bit line connected to the plurality of local bit lines of the second local bit line group, a sense amplifier connected to the first global bit line, and a sense amplifier connected to the second global bit line.

8. The device according to claim 1, wherein the memory cell array includes a first memory cell array, a second memory cell array, and a third memory cell array, a NAND type memory cell are arranged the first memory cell array, a 3-transistor type memory cell are arranged the second memory cell array, a 2-transistor type memory cell are arranged the third memory cell array.

9. The device according to claim 2, wherein the bit line arranged in the fuse cell array is a multiple-bit line.

10. The device according to claim 3, wherein the bit line arranged in the fuse cell array is a multiple-bit line.

11. The device according to claim 1, wherein the normal cell is selected by decoding an address signal given from the outside, and
   the fuse cell is selected by decoding an internal signal generated from a circuit which operates immediately after the power supply is turned on.

12. The device according to claim 2, wherein the normal cell is selected by decoding an address signal given from the outside, and
   the fuse cell is selected by decoding an internal signal generated from a circuit which operates immediately after the power supply is turned on.

13. The device according to claim 3, wherein the normal cell is selected by decoding an address signal given from the outside, and
   the fuse cell is selected by decoding an internal signal generated from a circuit which operates immediately after the power supply is turned on.

14. The device according to claim 9, wherein the normal cell is selected by decoding an address signal given from the outside, and
   the fuse cell is selected by decoding an internal signal generated from a circuit which operates immediately after the power supply is turned on.

15. The device according to claim 10, wherein the normal cell is selected by decoding an address signal given from the outside, and
   the fuse cell is selected by decoding an internal signal generated from a circuit which operates immediately after the power supply is turned on.

* * * * *